United States Patent [19]

Burnett et al.

[11] Patent Number: 4,904,506
[45] Date of Patent: Feb. 27, 1990

[54] COPPER DEPOSITION FROM ELECTROLESS PLATING BATH

[75] Inventors: Peter A. Burnett, Endicott; Dae Y. Jung, Endwell; Ronald A. Kaschak, Vestal; Roy H. Magnuson, Binghamton; Robert G. Rickert, Endwell; Stephen L. Tisdale, Vestal, all of N.Y.

[73] Assignee: International Business Machines Corporation, Armonk, N.Y.

[21] Appl. No.: 4,399

[22] Filed: Jan. 20, 1987

Related U.S. Application Data

[63] Continuation of Ser. No. 816,082, Jan. 3, 1986, abandoned.

[51] Int. Cl.$^4$ .............................................. B05D 1/18
[52] U.S. Cl. ................................ 427/443.1; 427/304; 427/305
[58] Field of Search ...................... 427/443.1, 304, 305

[56] References Cited

U.S. PATENT DOCUMENTS

| | | | |
|---|---|---|---|
| 2,938,805 | 5/1960 | Agens | 106/1 |
| 2,996,403 | 8/1961 | Lukes | 117/71 |
| 3,844,799 | 10/1974 | Underkofler et al. | 106/1 |
| 3,900,599 | 8/1975 | Feldstein | 427/97 |
| 4,152,467 | 5/1979 | Alpaugh et al. | 427/8 |
| 4,525,390 | 6/1985 | Alpaugh | 427/305 |
| 4,552,787 | 11/1985 | Chebinish | 427/305 |

*Primary Examiner*—Shrive Beck
*Assistant Examiner*—Vi Duong Dang
*Attorney, Agent, or Firm*—Pollock, Vande Sande & Priddy

[57] ABSTRACT

Copper is deposited onto a substrate by plating a first layer of copper onto the substrate from an electroless plating bath and plating a second layer of copper onto the first layer of copper from a second and different electroless plating bath. The first and second plating baths differ from each other in at least the cyanide content. The process reduces plating void defects and reduces nodule formation.

23 Claims, No Drawings

COPPER DEPOSITION FROM ELECTROLESS PLATING BATH

This is a continuation of Ser. No. 816,082, filed Jan. 3, 1986, now abandoned.

TECHNICAL FIELD

The present invention is concerned with a method for depositing copper onto a substrate from electroless plating baths. The present invention is especially directed to providing high-quality articles such as those to be employed in printed circuit applications such as printed circuit boards. The process of the present invention makes it possible to drastically reduce, if not eliminate, the presence of plating voids from the plating, while providing high quality ductile coatings.

The process of the present invention also makes it possible to drastically reduce the formation of extraneous copper or nodules.

BACKGROUND ART

The electroless plating of copper onto a substrate is well-known in the art. For instance, an electroless or autocatalytic copper plating bath usually contains a cupric salt, a reducing agent for the cupric salt, a chelating or complexing agent, and a pH adjustor. In addition, if the surface being plated is not already catalytic for the deposition of the desired metal, a suitable catalyst is deposited onto the surface prior to contact with the plating bath. Among the more widely employed procedures for catalyzing a surface is the use of stannous chloride sensitizing solution and a palladium chloride activator to form a layer of metallic palladium particles.

Although the technology relative to electroless copper plating is continually being improved, there still remains room for additional improvement. Certain problems are especially pronounced when preparing articles of very high quality such as those to be employed in printed circuit applications, e.g.—printed circuit boards which contain high-density circuitry and large numbers of holes such as through-holes and blind holes. The problems encountered include the formation of voids on the surface and in the coatings located in the holes. This, in turn, can cause unreliable electrical connections. Moreover, even if the electrical connections initially are adequate, the presence of voids tends to cause the coatings to crack during use of the circuits. During operation, integrated circuit boards tend to expand and contract somewhat. Any discontinuities in the coating represent a prime site for cracking due to the mechanical stress from such expansion and contraction.

Moreover, a major reason for yield loss in electroless plating is the formation of what is known as extraneous copper or copper nodules. The formation of nodules in unwanted areas on the substrate can result in short-circuiting by forming contact between circuit lines on the substrate. In addition, such processes as providing protective coatings, providing solder, and tin insertion are adversely affected by the presence of nodules on the surface.

Various attempts to reduce void formation result in a significant increase in the formation of nodules. Likewise, attempts to reduce nodule formation have resulted in significant increase in void formation. Accordingly, it would be advantageous and desirable to reduce the formation of voids without a significant increase in the formation of extraneous copper or nodules.

SUMMARY OF INVENTION

The present invention provides a method for significantly reducing, if not entirely eliminating, the formation of voids during plating from an electroless plating bath. In addition, the present invention makes it possible to reduce plating voids and drastically reduce the formation of extraneous copper and copper nodules.

The present invention makes it possible to achieve enhanced plating rates without a loss of stability in the second plating bath employed.

The present invention is concerned with a process for depositing copper onto a substrate from an electroless plating solution. In particular, the process of the present invention comprises plating a first layer of copper onto the desired substrate from a first alkaline electroless plating bath. The first alkaline plating bath contains 0 to about 2.3 ppm of cyanide ions and has an oxygen content of not lower than 1 ppm below saturation. A second layer of copper is plated onto the first layer of copper from a second alkaline electroless copper plating bath. The second electroless copper plating bath contains about 5 to about 11 ppm of cyanide ions and has an oxygen content of not lower than 1.5 ppm below saturation. The above oxygen content values are for the plating bath when the bath is at a temperature of about 70° C. to 80° C. Reference to the saturation level throughout the specification and claims of this application means the oxygen level that is achievable by using air saturation of the bath. However, this is not to be interpreted as requiring the use of air to achieve the necessary oxygen level.

BEST AND VARIOUS MODES FOR CARRYING OUT INVENTION

According to the present invention, it has been found that improved plating can be achieved by plating sequentially from two different electroless copper plating baths whereby the cyanide ion concentrations of each bath differ from each other and are judiciously selected.

In particular, the first plating bath contains 0 to about 2.3 ppm of cyanide ions. In addition, it is important for the success of the present invention that the oxygen content of the first plating bath not be less than 1 ppm below saturation (i.e.—saturation being the oxygen level that is achievable by saturation using air).

The second electroless copper plating bath contains about 5 to about 11 ppm of cyanide ions. Moreover, it is important for the success of the present invention that the oxygen content of the second plating bath not be less than 1.5 ppm below saturation (i.e. —saturation being the oxygen level that is achievable by saturation using air).

The above oxygen content values are for the plating bath when at a temperature of about 70° C. to 80° C.

The surface upon which the metal is plated must be catalytic for the deposition of the copper. For instance, in the event the surface to be plated in not already catalytic for the deposition of the copper, a suitable catalyst is deposited on the surface prior to contact with the electroless copper plating baths. In the preferred aspects of the present invention, the substrate to be plated is a dielectric substrate which must be rendered catalytic for the deposition of the copper. Dielectric substrates described in the prior art, including thermoplastic and thermosetting resins and glass, may be plated in accordance with the present invention.

Typical thermosetting polymeric materials include epoxy, phenolic-based materials, and polyamides. The dielectric materials may be molded articles of the polymers containing fillers and/or reinforcing agents such as glass-filled epoxy or phenolic-based materials. Examples of some phenolic-type materials include copolymers of phenol, resorcinol, and cresol. Examples of some suitable thermoplastic polymeric materials include polyolefins such as polypropylene, polysulfones, polycarbonates, nitrile rubbers, and ABS polymers.

The present invention is suitable for plating at least one of the main surfaces of the substrate as well as the plated through-holes or vias and/or blind holes of the substrate when present. The present invention provides good plating even in holes having high aspect ratios.

Prior to the initiation of the process of the present invention for plating the dielectric substrate, the holes, if to be present in the circuit board, are made and the dielectric with the holes is suitably cleaned and preconditioned.

For instance, the preconditioning can include creation of active sites by physical means such as sand and/or vapor blasting and/or chemical methods such as solvent swelling. A typical solvent is N-methyl pyrrolidone. The substrate can also be pretreated with a sulfochromic acid composition.

Among the more widely employed procedures for catalyzing or seeding a substrate is the use of a stannous chloride sensitizing solution and a palladium chloride activator to form a layer of metallic palladium particles. For instance, one method for catalyzing a dielectric substrate is exemplified by U.S. Pat. No. 3,011,920 which includes sensitizing the substrate by treating it with a solution of colloidal metal, accelerating the treatment with a selective solvent to remove protective colloids for the sensitized dielectric substrate, and then electrolessly depositing the copper onto the sensitized substrate.

Also, as suggested, for example, in U.S. Pat. No. 3,099,608, a dielectric substrate can be pretreated by depositing a thin film of "conductivator" type of metal particle such as palladium metal from a semicolloidal solution onto the dielectric substrate to provide a conducting base which permits electroplating with a conductive metal on the "conductivated" base. Moreover, U.S. Pat. No. 3,632,388 suggests a method for treating a polymeric plastic substrate in a plating process which utilizes a preliminary chromic acid etch followed by a one-step activation in a tin-palladium hydrosol.

More recently, U.S. Pat. No. 4,066,809 discloses the use of a so-called "triple seeding" technique. This technique includes contacting the surfaces of the dielectric substrate first with a stannous chloride sensitizing solution, then with a palladium chloride activator, and then with a palladium chloride/stannous chloride/hydrochloric acid seeder bath.

In the present invention, prior to the stannous-chloride and palladium-chloride treatment, the substrate can be treated with an aqueous solution containing a multifunctional ionic polymer, as disclosed in Bupp, et al. U.S. Pat. No. 4,478,883 and Bupp, et al. U.S. patent application Ser. No. 696,879, now U.S. Pat. No. 4,554,182 disclosures of which are incorporated herein by reference.

The polymer is a multifunctional ionic material in that it contains at least two active or available ionic functional moieties of the same polarity. The polymers are at least water-miscible and are preferably water-soluble or at least soluble in the water compositions employed in the present invention. The preferred ionic moieties are cationic moieties such as quaternary phosphonium and quaternary ammonium groups. Polymers containing at least two ionic moieties are commercially available and need not be described herein in any great detail. Examples of commercially available multifunctional cationic polymers are Reten 210, Reten 220, and Reten 300, available from Hercules, descriptions of which can be found in "Water-Soluble Polymers", Bulletin VC-482A, Hercules Incorporated, Wilmington, Delaware 19899, disclosure of which is incorporated herein by reference.

The Reten polymers are high molecular weight polymers (usually about 50000 to about 1,000,000 or more), and have a main chemical backbone structure of polyacrylamide.

The ionic polymer is usually employed as a dilute aqueous solution of about 0.01% to about 1% by weight and more usually, about 0.05% to about 0.5% by weight of the copolymer. The aqueous solution also usually contains an inorganic acid such as $H_2SO_4$ or HCl to provide a pH of about 0 to about 7 and more usually, a pH of about 0 to about 3. The acid is usually present in amounts of about 2% to about 10% by weight.

The treatment with the ionic polymer is generally about 1 minute to about 10 minutes.

After the substrate is contacted with the ionic polymer composition, the substrate is rinsed to remove any excess polymer not absorbed by the substrate.

Next, the substrate is activated by contact with the composition containing a catalytic composition capable of initiating the electroless copper plating process. The compositions contain a metal which can directly provide the catalytic sites or serve as a precursor which leads to the catalytic sites. The metal present may be in the elemental form, an alloy, or compound, or mixtures thereof. The preferred metal catalysts are precious metals such as gold, palladium, and platinum. In addition, in view of the improved conditioning of the substrate achieved by employing the multifunctional polymer, the catalyst can be a non-precious metal such as copper, nickel, cobalt, iron, zinc, manganese, and aluminum.

The most preferred catalyst is palladium. A typical palladium composition contains about 1.2 to about 2.5 grams per liter of a palladium salt which is preferably $PdCl_2$, about 80 to about 150 grams per liter of a stannous salt which is preferably $SnCl_2 \cdot 2H_2O$, and about 100 to about 150 milliliters per liter of an acid which is preferably HCl. When HCl is provided in the form of a 37% HCl solution, about 280 to about 360 milliliters of the HCl solution is preferably employed. The most preferred composition contains about 1.5 grams per liter of $PdCl_2$ and about 280 milliliters per liter of 37% HCl. The composition is usually maintained at a temperature of about 65°±10° F.

A typical triple-seeder process is disclosed, for instance, in Alpaugh, et al. U.S. Pat. No. 4,525,390, disclosure of which is incorporated herein by reference.

The first electroless plating bath employed in accordance with the present invention contains up to about 2.3 ppm and preferably, about 0.2 to about 2.3 ppm and most preferably, about 0.5 to about 2 ppm of cyanide ions.

The first electroless plating bath employed in accordance with the present invention has an oxygen content of not lower than 1 ppm below saturation and preferably not lower than 0.5 ppm below saturation. In the most preferred aspects of the present invention, the oxygen content of the first electroless plating bath is at or about at the saturation level achievable using air. These values of the oxygen content are for the bath when at a room temperature of about 70° C. to 80° C.

The first copper electroless plating bath employed is generally an aqueous composition which contains a source of cupric ion, a complexing agent for the cupric ion, and a pH adjustor in addition to the cyanide ion source and oxygen. In addition, the plating bath also preferably includes a surface-active agent.

The cupric ion source generally used is a cupric sulfate or a cupric salt of the complexing agent to be employed.

The cupric ion source is employed in amounts of about 7 to about 12 grams per liter and preferably, about 8.0 to about 10.0 grams per liter and most preferably, about 8.5 to about 9.5 grams per liter, calculated as $CuSO_4 \cdot 5H_2O$. In other words, when the cupric ion source is $CuSO_4 \cdot 5H_2O$, then the amount is about 7 to about 12 grams per liter, and when the source is a different material, the amount employed will be such that the same amount of cupric ion will be present in the bath as when $CuSO_4 \cdot 5H_2O$ is used.

Examples of some cyanides which can be employed according to the present invention are the alkali metal, alkaline earth metal, and ammonium cyanides, with sodium cyanide being preferred.

The most common reducing agent employed is formaldehyde. Examples of some other reducing agents include formaldehyde precursors or formaldehyde homopolymers such as paraformaldehyde, trioxane, and glyoxal; borohydrides such as alkali metal borohydrides (sodium and potassium borohydrides) and substituted borohydrides such as sodium trimethoxy borohydride; boranes such as amine borane (isopropyl amine borane and morpholine borane); and hypophosphite reducing agents.

The reducing agent is generally present in amounts from about 1 to about 6 milliliters per liter, preferably about 2 to about 4 milliliters per liter, nd more preferably from about 2 to about 2.5 milliliters per liter.

Examples of some suitable complexing agents include Rochelle salts, ethylene diamine tetraacetic acid, the sodium (mono-, di-, tri-, and tetra-sodium) salts of ethylene diamine tetraacetic acid, nitrilo tetraacetic acid and its alkali salts, gluconic acid, gluconates, triethanol amine, glucono (gamma)-lactone, modified ethylene diamine acetates, such as N-hydroxy ethyl ethylene diamine triacetate. In addition, a number of other suitable cupric complexing agents are suggested in U.S. Pat. Nos. 2,996,408; 3,075,856; 3,076,855; and 2,938,805. The preferred complexing agents are ethylene diamine tetraacetic acid and the alkali metal salts thereof.

The amount of complexing agent employed in the first plating bath is about 30 to about 50 grams per liter.

The plating bath can also include a surfactant which assists in wetting the surface to be coated. A satisfactory surfactant is, for instance, an organic phosphate ester, available under the trade designation "Gafac RE-610". Generally, the surfactant is present in amounts from about 0.02 to about 0.3 grams per liter.

In addition, the pH of the bath is generally controlled, for instance, by the addition of a basic compound such as sodium hydroxide or potassium hydroxide in the desired amount to achieve the desired pH.

The preferred pH of the first electroless plating bath is between 11.5 and 12.0 and most preferably between 11.6 and 11.8.

In addition, the plating bath can include other minor additives, as is known in the art.

The preferred plating baths employed have a specific gravity within the range of 1.06 to 1.08. Moreover, the temperature of the bath is preferably maintained between about 70° C. and 80° C., more preferably between about 70° C. and 75° C., and most preferably about 72° C. to about 74° C.

The plating with the initial electroless plating bath is generally carried out for about 15 minutes to up to about 2 hours and preferably about ½ to 1½ hours.

For highest quality, final product (e.g.—high ductility copper) it is preferred that the plating with the initial electroless plating bath does not exceed about 10% of the total plating thickness. The initial plating bath is suitable for providing on catalyzed or seeded dielectric surfaces, coatings that exhibit a significant reduction in plating defects and plating voids on such surfaces.

By employing an initial plating bath for application of a relatively thin layer of copper and a second plating bath for plating completion essentially allowing for segregation of plating functions, nodule formation and the subsequent defects associated therewith, such as potential shorts, damage from attempts to remove nodules, and leakage failure are dramatically reduced, if not entirely eliminated.

Moreover, there is a lower tendency for the initial plating bath to attack and dissolve the catalyst coating as compared to other plating baths of comparative stability, but containing higher cyanide than in the initial plating bath, along with high amounts of oxygen. The catalyst coating is essential to the proper seeding and catalyzing of the dielectric substrate.

After the initial layer of copper is plated, the plated substrate is subjected to a second and different electroless plating bath. The chemical composition of the initial bath itself can be changed by the overflow and the amount of constituents being added, or preferably the substrates can be removed from the plating tank and placed into a plating tank containing the second electroless plating bath. In particular, the second electroless plating bath can contain the same constituents as contained in the first electroless plating bath, except that relative amounts of various of the constituents are changed in order to achieve the high ductility minimal nodule formation and expedient plating rate.

The second electroless plating bath contains about 5 to about 11 ppm and preferably about 5 to about 8 ppm of cyanide ions.

The second electroless plating bath employed in accordance with the present invention has an oxygen content of not lower than 1.5 ppm below saturation, preferably an oxygen content of not lower than 1.0 ppm below saturation, and more preferably not lower than 0.5 ppm below saturation. In the most preferred aspects of the present invention, the oxygen content of the second electroless plating bath is at or about saturation.

The values of the oxygen content are for the bath when at a temperature of about 70° C. to about 80° C.

The oxygen saturation level of the baths in accordance with the present invention at temperatures of about 70° C. to 80° C. is typically about 3.5.

The above amounts of oxygen are those measured at the bath temperature by employing a Leeds & Northrup dissolved oxygen meter and probe as calibrated to air saturation in deionized water at the bath temperature.

The level of the oxygen is maintained by introducing into the plating tank a mixture of oxygen and inert gas, preferably by adding air. Mixed with the air or oxygen can be an inert gas such as hydrogen, nitrogen, argon, neon, and krypton. At a plating temperature of about 73° C.±0.5° C., about 1.0 to 3.0 SCFM (standard cubic feed per minute) per thousand gallons of bath of air are employed.

When used, the inert gas is preferably premixed with the oxygen or air prior to the introduction into the bath. However, the individual gases can be introduced into the bath separately, if desired.

An advantage of the present invention from a practical operational viewpoint is that the amounts of oxygen which are used in both baths can be merely monitored rather than precisely controlled as required by those prior baths which employ very low oxygen contents. Shifts during use in the oxygen level outside of the low levels of oxygen required in various prior art baths can occur and, depending upon the duration and extent of the shift, can result in adverse effects on the plating.

The cupric ion source in the second electroless plating bath is employed in amounts of about 9 to about 14, and preferably about 10 to about 12 grams per liter, calculated as $CuSO_4 \cdot 5H_2O$.

The reducing agent is present in amounts of about 1 to about 4 milliliters per liter and preferably about 2 to about 2.5 milliliters per liter. The preferred reducing agent is formaldehyde and is preferably employed as a 37% solution. The above amounts of formaldehyde are the values obtained by the sodium sulfite method by titration to a pH of 9.00, as generally discussed by Walker, Formaldehyde, Third Edition, 1975, pages 486–488, Robert E. Kreiger Publishing Company, Huntington, N.Y.

The amount of complexing agent employed in the second electroless plating bath is about 25 to about 50 grams per liter and preferably about 30 to about 40 grams per liter.

The amount of surfactant, if present, is usually about 0.01 to about 0.3 grams per liter.

In addition, the preferred pH of the second electroless plating bath is between 11.6 and 12.0 and most preferably between 11.7 and 11.9. In addition, the second electroless plating bath has a specific gravity within the range of 1.060 to 1.080. Moreover, the temperature of the second electroless plating bath is preferably maintained between about 70° C. and 80° C., more preferably between about 70° C. and 76° C., and most preferably about 72° C. to about 75° C.

The plating from the second electroless plating bath is generally from about 8 to about 20 hours or until the desired thickness of copper film is achieved.

Use of the second electroless plating bath provides for improved ductility of the copper. It is believed that the higher cyanide content tends to prevent or avoid the absorption of hydrogen gas on the surface which tends to cause embrittlement of the plated copper. It has been observed that the cyanide is preferentially absorbed onto the copper surface, thereby preventing the absorption of hydrogen gas thereon. Moreover, the quantity of oxygen and cyanide in the second electroless plating bath tends to prevent nodular formation. However, if the second electroless plating bath were employed as the initial plating bath to coat onto the seeded or catalyzed dielectric substrate, such would tend to result in plating voids and defects and, as stated hereinabove, would tend to attack and dissolve the catalyst coating on the dielectric substrate.

If desired, the second electroless plating bath can be operated at increased plating rate with-out loss of bath stability or with increased nodule formation.

The following non-limiting examples are presented to further illustrate the present invention.

EXAMPLE 1

The epoxy-glass laminate boards are treated as follows:

The laminate boards are cleaned in hot K-2 solution and rinsed in hot deionized water.

The boards are then immersed into a bath of about 0.05 grams of Reten 210 per liter of a 2% volume $H_2SO_4$ aqueous solution. The boards are then rinsed in deionized water.

The boards are then immersed for about 3 minutes in a colloidal palladium-tin catalyst bath available under the trade designation 57B catalyst from Selrex.

The coated substrates are rinsed in deionized water and then immersed into an 8% by volume HCl aqueous bath for about 2 minutes at about room temperature. The substrates are then rinsed in deionized water and dried in an oven. The substrates are then subjected to photoprocessing employing a negative photoresist available under the trade designation T-168 from DuPont de Nemours to image the circuit lines on the substrate.

The substrates are then immersed in a plating tank containing an electroless copper plating bath having about 9.2 grams per liter of $CuSO_4 \cdot 5H_2O$, about 37.3 grams per liter of ethylene diamine tetraacetic acid, about 2.0 ppm of cyanide, as NaCN, about 2.5 milliliters per liter of formaldehyde, 3.0 to 3.1 ppm of dissolved oxygen, a pH of 11.7, a specific gravity of 1.065. The bath plates at a rate of at least about 0.1 mils per hour.

Substrates are immersed in the first plating bath for about 45 minutes. After the duration of about 45 minutes plating, the boards are removed from the first plating bath and immersed into a second plating bath.

The second plating bath contains 11 to 12 grams per liter of $CuSO_4 \cdot 5H_2O$, about 36.4 grams of ethylene diamine tetraacetic acid, about 15.5 ppm of cyanide, as NaCN, about 2.5 milliliters per liter of formaldehyde, about 3.1 ppm of dissolved oxygen, has a pH of about 11.7, and a specific gravity of about 1.066. The plating in the second plating bath is continued until about 1.45 mils of copper are plated on the substrates.

The boards are removed from the plating tank and inspected. Almost no extraneous copper is found and the number of nodules on circuit lines is extremely low. In addition, no voids were observed on the boards. The boards passed all the other usual inspection tests employed commercially

EXAMPLE 2

Example 1 is repeated, except that the substrates employed are triple seeded substrates prepared in accordance with the procedure disclosed in U.S. Pat. No. 4,525,390, followed by the copper plating process of Example 1 hereinabove. The results obtained are similar to those of Example 1.

We claim:

1. A process for plating copper onto a substrate that is catalytic for the deposition of copper thereon which comprises plating a first layer of copper onto said substrate from a first alkaline electroless copper plating bath containing up to about 2.3 ppm of cyanide ions and having an oxygen content of not less than about 2.5 ppm; plating a second layer of copper onto said first layer of copper from a second alkaline electroless copper plating bath containing about 5 to 11 ppm of cyanide ion and having an oxygen content of not less than 1.5 ppm below saturation.

2. The process of claim 1 wherein said substrate is a dielectric substrate rendered catalytic for the deposition of the copper.

3. The process of claim 2 which includes seeding the dielectric substrate with a seeder composition containing palladium and tin.

4. The process of claim 3 wherein prior to seeding the substrate is contacted with a composition containing a multifunctional ionic polymer material containing at least two available ionic moieties, wherein said ionic moieties are of a charge opposite from the charge associated with the seeder particles to be subsequently applied to the substrate.

5. The process of claim 4 wherein said multifunctional ionic polymer material is a multifunctional cationic material.

6. The process of claim 4 wherein said multifunctional ionic polymer material is a copolymer of acrylamide and ammonium quaternary compounds.

7. The process of claim 4 wherein said multifunctional ionic polymer material is a copolymer of acrylamide and betamethacryloxyethyltrimethyl ammonium methyl sulfate.

8. The process of claim 1 wherein the oxygen content of said first alkaline electroless copper plating bath is not less than 0.5 ppm below saturation.

9. The process of claim 1 wherein the oxygen content of said first alkaline electroless copper plating bath is at about saturation.

10. The process of claim 1 wherein the oxygen content of said second alkaline electroless copper plating bath is not less than 1 ppm below saturation.

11. The process of claim 1 wherein the oxygen content of said second alkaline electroless copper plating bath is not less than 0.5 ppm below saturation.

12. The process of claim 1 wherein the oxygen content of said second alkaline electroless copper plating bath is at about saturation.

13. The process of claim 1 wherein said first electroless plating bath contains about 0.2 to about 2.3 ppm of cyanide ions.

14. The process of claim 1 wherein said first electroless plating bath contains about 0.5 to about 2 ppm of cyanide ions.

15. The process of claim 1 wherein said second electroless plating bath contains about 5 to about 11 ppm of cyanide ions.

16. The process of claim 1 wherein said second electroless plating bath contains about 5 to about 8 ppm of cyanide ions.

17. The process of claim 1 wherein said first alkaline electroless copper plating bath contains a cupric ion source in amounts of about 7 to about 12 grams per liter calculated as $CuSO_4 \cdot 5H_2O$; about 1 to about 6 milliliters per liter of a reducing agent; about 30 to about 50 grams per liter of complexing agent for the cupric ions; has a pH of about 11.5 to about 12.0; and is at a temperature between about 70° C. and 80° C.

18. The process of claim 17 wherein said cupric ion source is $CuSO_4 \cdot 5H_2O$, said reducing agent is formaldehyde, and said complexing agent is ethylene diamine tetraacetic acid or salt thereof, and said cyanide is an alkali metal cyanide.

19. The process of claim 17 wherein the second electroless plating bath contains about 9 to about 14 grams per liter of cupric ion source, calculated as $CuSO_4 \cdot 5H_2O$; a reducing agent in amounts of about 1 to about 4 milliliters per liter; a complexing agent in amounts of about 25 to about 50 grams per liter; has a pH of about 11.6 to about 12.0; and is at a temperature of about 70° C. to about 80° C.

20. The process of claim 17 wherein said cupric ion source is $CuSO_4 \cdot 5H_2O$, said reducing agent is formaldehyde, said complexing agent is ethylene diamine tetraacetic acid or salt thereof.

21. The process of claim 1 wherein the first and second electroless plating baths are maintained at a temperature of about 70° C. to about 75° C. during plating.

22. The process of claim 1 wherein the first and second electroless plating baths are maintained at a temperature of about 72° C. to about 75° C. during plating.

23. The process of claim 1 wherein the plating with the first electroless plating bath is for a maximum of about 10% of the total plating and the plating with the second electroless plating bath is required to reach the final desired thickness.

* * * * *